United States Patent
Xie et al.

(10) Patent No.: US 11,069,680 B2
(45) Date of Patent: Jul. 20, 2021

(54) FINFET-BASED INTEGRATED CIRCUITS WITH REDUCED PARASITIC CAPACITANCE

(71) Applicant: International Business Machines Corporation, Armonk, NY (US)

(72) Inventors: Ruilong Xie, Niskayuna, NY (US); Juntao Li, Cohoes, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/368,838

(22) Filed: Mar. 28, 2019

(65) Prior Publication Data

US 2020/0312843 A1  Oct. 1, 2020

(51) Int. Cl.
*H01L 27/088* (2006.01)
*H01L 29/78* (2006.01)
*H01L 29/66* (2006.01)
*H01L 21/8234* (2006.01)

(52) U.S. Cl.
CPC .. *H01L 27/0886* (2013.01); *H01L 21/823431* (2013.01); *H01L 21/823437* (2013.01); *H01L 21/823468* (2013.01); *H01L 21/823475* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,630,699 B1 | 10/2003 | Wylie | |
| 6,838,869 B1 | 1/2005 | Rogers et al. | |
| 9,026,975 B2 | 5/2015 | Song et al. | |
| 9,379,210 B2 | 6/2016 | Mountsier et al. | |
| 9,443,853 B1 * | 9/2016 | Cheng | H01L 29/0649 |
| 9,536,980 B1 | 1/2017 | Huang et al. | |
| 10,056,468 B2 | 8/2018 | Samavedan et al. | |
| 2012/0267706 A1 | 10/2012 | Luo et al. | |

(Continued)

FOREIGN PATENT DOCUMENTS

WO   WO2016160313 A1   10/2016

OTHER PUBLICATIONS

Kunz et al., "Reduction of Parasitic Capacitance in Vertical MOSFETs by Spacer Local Oxidation", IEEE Transactions on Electron Devices, vol. 50, No. 6, Jun. 2003, 1487-1493 Plus Cover Sheet.

*Primary Examiner* — Moazzam Hossain
*Assistant Examiner* — Stanetta D Isaac
(74) *Attorney, Agent, or Firm* — Erik Johnson; Otterstedt, Wallace & Kammer, LLP

(57) ABSTRACT

An integrated circuit includes a first set of fins, a second set of fins, a gate, and a dielectric plug. The second set of fins is discrete from the first set of fins, and the gate passes over the first set of fins and the second set of fins. The dielectric plug is surrounded by the gate on two sides where the gate passes between the first set of fins and the second set of fins. Incorporation of aspects of the invention into integrated circuits with fin-based field effect transistors (FinFETs) helps to reduce parasitic capacitance between gate features and other nearby electrically conductive features.

13 Claims, 14 Drawing Sheets

(56) References Cited

U.S. PATENT DOCUMENTS

| | | |
|---|---|---|
| 2018/0025907 A1 | 1/2018 | Kalutarage et al. |
| 2018/0158841 A1 | 6/2018 | Glass et al. |
| 2018/0212029 A1 | 7/2018 | Xu et al. |
| 2018/0277655 A1 | 9/2018 | Samavedan et al. |

* cited by examiner

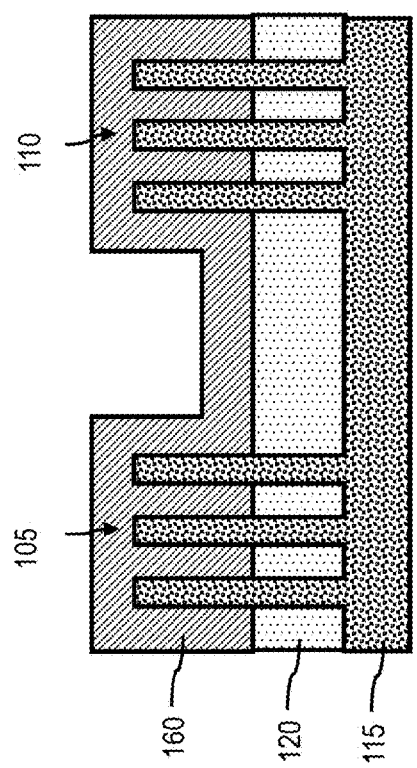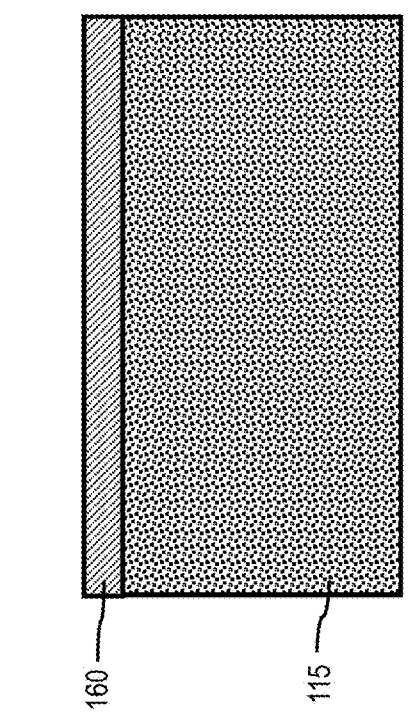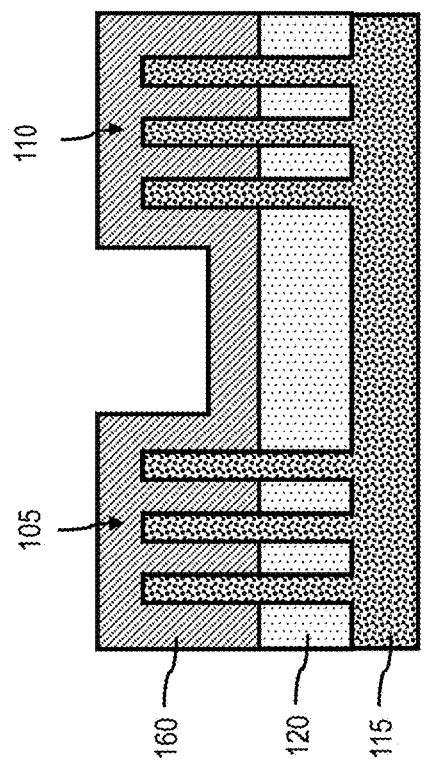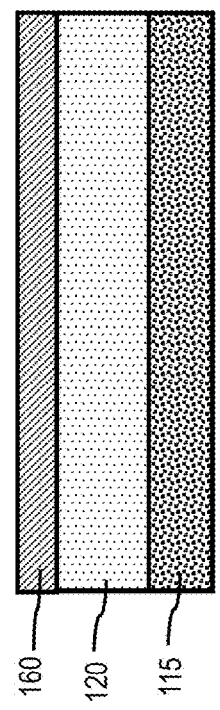

FINFET-BASED INTEGRATED CIRCUITS WITH REDUCED PARASITIC CAPACITANCE

BACKGROUND

The present invention relates to the electrical, electronic, and computer arts, and, more particularly, to FinFET-based integrated circuits with reduced parasitic capacitance.

Multi-gate field-effect transistors (FETs) are of considerable interest because of their superior electrostatic integrity, as well as their promise of lower supply voltages, reduced threshold voltages, and extended scalability. Fin-based FETs (FinFETs) are one form of such multi-gate devices. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds.

Nevertheless, because of the closely spaced and often relatively long conductive features in modern FinFETs, parasitic capacitance remains a hurdle to device performance. For example, in many FinFET designs, gate features and contact features may run adjacent to each other for relatively long distances. There is, as a result, a need for new designs and methods that address the detrimental parasitic interactions between nearby features.

SUMMARY

Embodiments in accordance with aspects of the invention provide FinFET-based integrated circuits, and methods for forming such integrated circuits, with reduced parasitic capacitance between gate features and other nearby features.

Aspects of the invention are directed to an integrated circuit comprising a first set of fins, a second set of fins, a gate, and a dielectric plug. The second set of fins is discrete from the first set of fins, and the gate passes over the first set of fins and the second set of fins. The dielectric plug is surrounded by the gate on two sides where the gate passes between the first set of fins and the second set of fins.

Additional aspects of the invention are directed to a method of forming an integrated circuit. A partially processed integrated circuit is received with a first set of fins and a second set of fins discrete from the first set of fins. A gate is formed that passes over the first set of fins and the second set of fins. The gate surrounds a dielectric plug on two sides where the gate passes between the first set of fins and the second set of fins.

Even additional aspects of the invention are directed to an integrated circuit formed at least in part by receiving a partially processed integrated circuit with a first set of fins and a second set of fins discrete from the first set of fins. A gate is then formed that passes over the first set of fins and the second set of fins. The gate surrounds a dielectric plug on two sides where the gate passes between the first set of fins and a second set of fins.

BRIEF DESCRIPTION OF THE DRAWINGS

These and other features, aspects, and advantages of the present invention will become better understood with regard to the following description, appended claims, and accompanying drawings where:

FIGS. 5A-5D show sectional views of an intermediate film stack produced by forming a first dummy gate layer in accordance with the FIG. 3 method;

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein and in the appended claims, the relative positional terms "lateral to" and "horizontally level with," when used to describe aspects of an integrated circuit comprising fins, are indexed to an orientation like those in the attached figures wherein a substrate is located at the bottom and the fins protrude straight upward from the substrate so that the fins are oriented vertically. Moreover, where a material name is presented herein, that name is intended to describe the essential components of the material 125 but is not intended to indicate the proportions of these essential components within the material. For example, "silicon oxide" would encompass a material that consists essentially of silicon and oxygen atoms independent of the proportion of oxygen atoms to silicon atoms. Lastly, the word "discrete" is intended to mean separate and non-touching.

Figure 1:
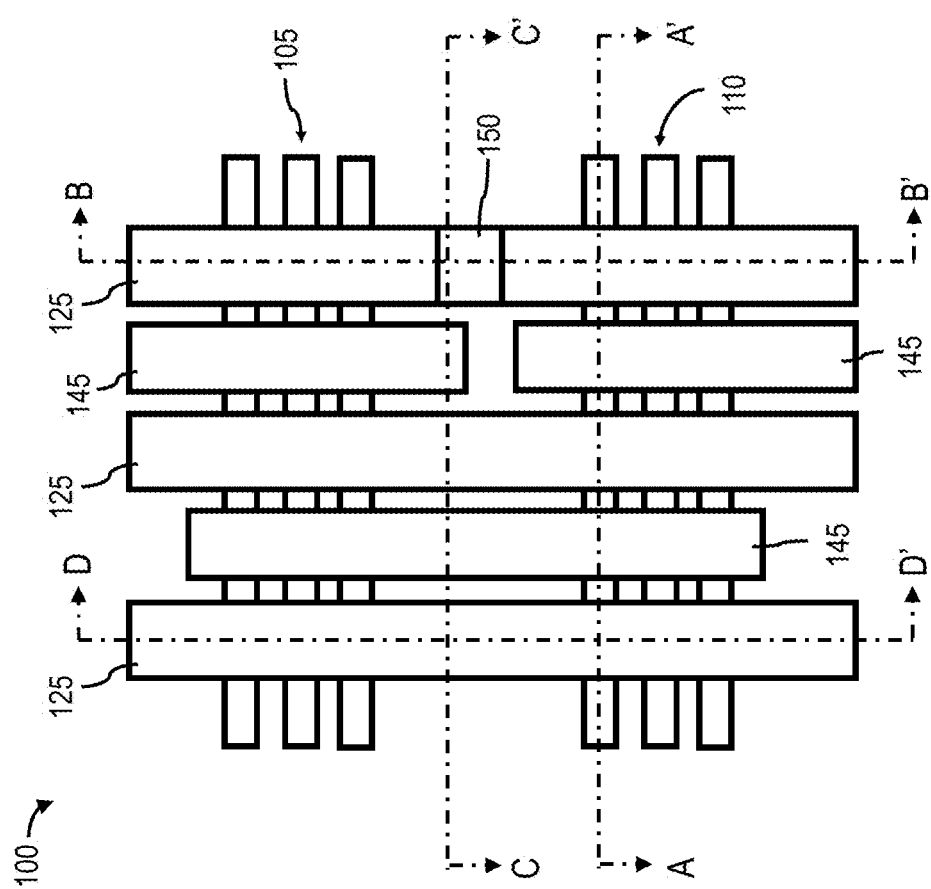
FIG. 1 shows a plan view of a FinFET layout in accordance with an illustrative embodiment of the invention.
Figure 2B:
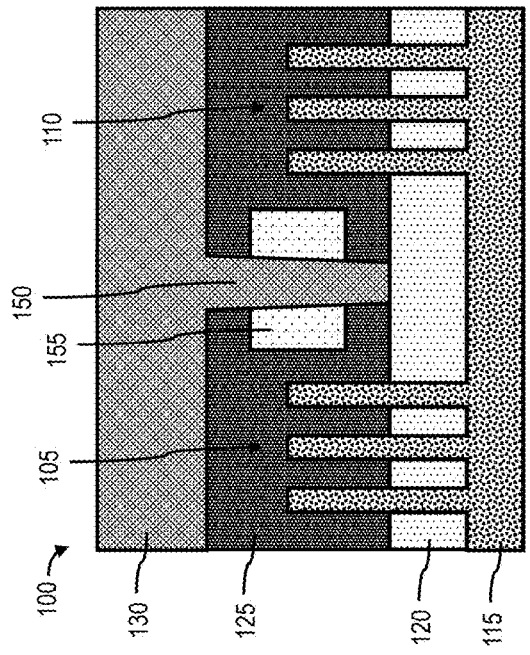
FIGS. 2A-2D show sectional views of the FIG. 1 FinFET layout along the cleave planes indicated in FIG. 1.
Figure 2D:
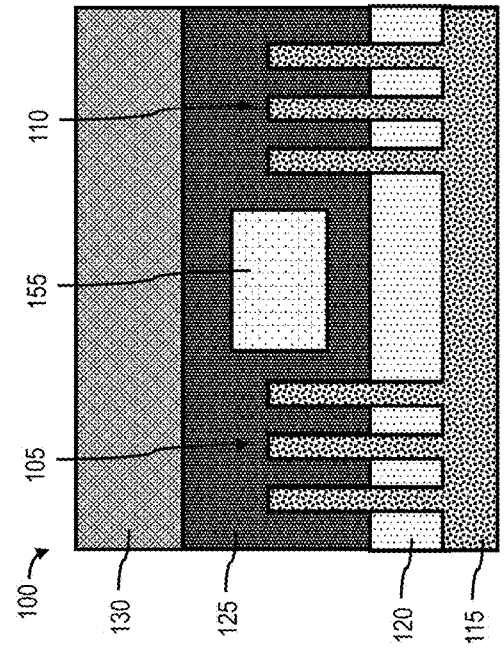
Figure 2A:
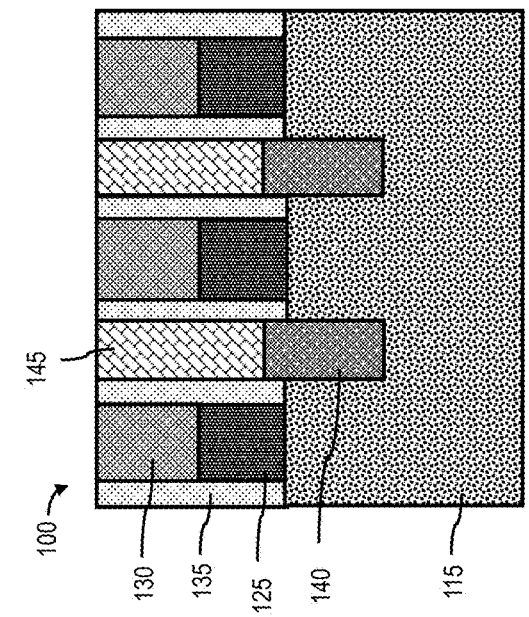
Figure 2C:
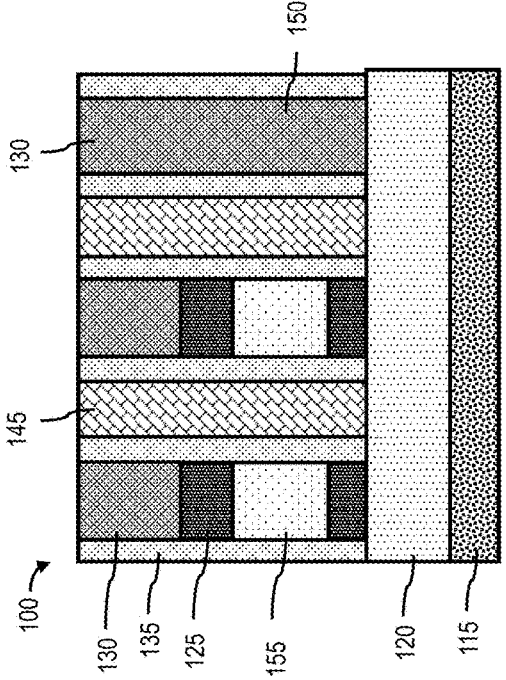

FIG. 1 shows a plan view of a novel FinFET layout 100 in accordance with an illustrative embodiment of the invention. FIGS. 2A-2D show sectional views of the FinFET layout 100, with FIG. 2A showing the FinFET layout 100 along the A-A' cleave plane in FIG. 1, FIG. 2B showing the FinFET layout 100 along the B-B' cleave plane in FIG. 1, FIG. 2C showing the FinFET layout 100 along the C-C' cleave plane in FIG. 1, and FIG. 2D showing the FinFET layout 100 along the D-D' cleave plane in FIG. 1. It is contemplated that the FinFET layout 100 will constitute a portion of a larger integrated circuit when actually reduced to practice. The FinFET layout 100 may, for example, be applied in a chip design falling into the sub-20-nm logic node.

In the FinFET layout 100, a first set of fins 105 and a second set of fins 110 protrude vertically upward from a substrate 115. A shallow-trench-isolation layer (STI layer 120) is disposed on top of the substrate 115, and a series of gates 125 are disposed on top of the STI layer 120. The gates 125 run perpendicular to the fins 105, 110 and pass over the fins 105, 110 so that the gates 125 contact each of the fins 105, 110 on three sides. Each of the gates 125 is topped by a respective self-aligned contact cap (SAC cap 130) that runs along the length of that gate, and each of the discrete gate/SAC-cap stacks is disposed between two respective sidewall spacers 135. Epitaxial features form source/drains (epi-S/Ds 140) in the tops of the fins 105, 110 on either side of the gates 125. Contacts to these epi-S/Ds 140 is via contacts-to-source/drains (TS contacts 145) that run parallel to the gates 125 and also pass over the fins 105, 110. A gate cut feature (CT cut 150) acts to partition a gate at one point along its length.

Continued reference to FIGS. 1-2D will reveal that the gates 125 and the TS contacts 145 run parallel and in close proximity to each other for relatively long distances in the FinFET layout 100. Each TS contact 145 is separated from a gate 125 by one of the sidewall spacers 135. As would be expected, the gates 125 and the TS contacts 145 are formed of electrically conductive materials. Accordingly, these features may interact with each other to create parasitic capacitance that can adversely affect the performance of the device.

Parasitic capacitance between nearby parallel conductors is dependent on the area of overlap between these conductors. Aspects of the invention address the gate-to-TS-contact source of parasitic capacitance in the FinFET layout 100 by incorporating novel dielectric plugs 155 into the design. Each of the gates 125 surrounds a respective dielectric plug 155 on two sides where the gate 125 passes between the first set of fins 105 and the second set of fins 110. At the same time, each of the dielectric plugs 155 is positioned laterally between two respective sidewall spacers 135. In this manner, two sidewall spacers 135 abut opposing sides of each gate 125 and opposing sides of each dielectric plug 155. So formed, each of the dielectric plugs 155 is positioned lateral to and horizontally level with a portion of a TS contact 145. As their name would indicate, the dielectric plugs 155 are formed of a dielectric material. The dielectric plugs 155 thereby reduce the amount of overlap between adjacent conductors by replacing a conductive portion of each of the gates 125 with a non-conductive material. Parasitic capacitance between the gates 125 and the TS contacts 145 is thereby reduced.

Except for the novel dielectric plugs 155, the function of the above-described elements in the FinFET layout 100 will be largely familiar to one having ordinary skill in the relevant arts. Aspects of FinFET-based integrated circuits are also described in other readily available references, including, for example, J. G. Fossum et al., *Fundamentals of Ultra-Thin-Body MOSFETs and FinFETs*, Cambridge University Press, 2013, which is hereby incorporated by reference herein.

With regard to the composition of the various components of the FinFET layout 100, the substrate 115 and the fins 105, 110 may comprise, for example, a semiconductor material such as crystalline silicon, which may be doped with boron or phosphorous to be p- or n-type. The STI layer 120 may comprise a dielectric material such as silicon oxide. The gates 125 may be formed as high-k metal gates (HKMGs). HKMGs comprise a high-k dielectric layer in combination with a metal gate feature. The high-k dielectric layer may comprise, as just a few non-limiting examples, hafnium silicon oxide, zirconium silicon oxide, hafnium oxide, or zirconium oxide. The metal gate feature may comprise, again, as just a few non-limiting examples, a work-function-tunable material such as titanium nitride, titanium aluminum nitride, titanium silicon nitride, tantalum nitride, tantalum aluminum nitride, or tantalum silicon nitride. The SAC caps 130 and the CT cut 150 may comprise a dielectric material such as silicon nitride, silicon carbon oxide, silicon oxygen carbon nitride, silicon boron carbon nitride, silicon oxide, or a combination thereof, while the sidewall spacers 135 may comprise a dielectric material such as silicon oxynitride, silicon oxygen carbon nitride, silicon boron carbon nitride, or silicon nitride. The epi-S/Ds 140 may comprise a crystalline or semi-crystalline semiconductor material such as doped silicon or silicon germanium. Finally, the TS contacts 145 may comprise a conductive metal such as tungsten, copper, or ruthenium. Nevertheless, it is again emphasized that the material choices recited herein are only by way of example, and any other suitable materials may be utilized and the results will still fall within the scope of the present invention.

Figure 3:
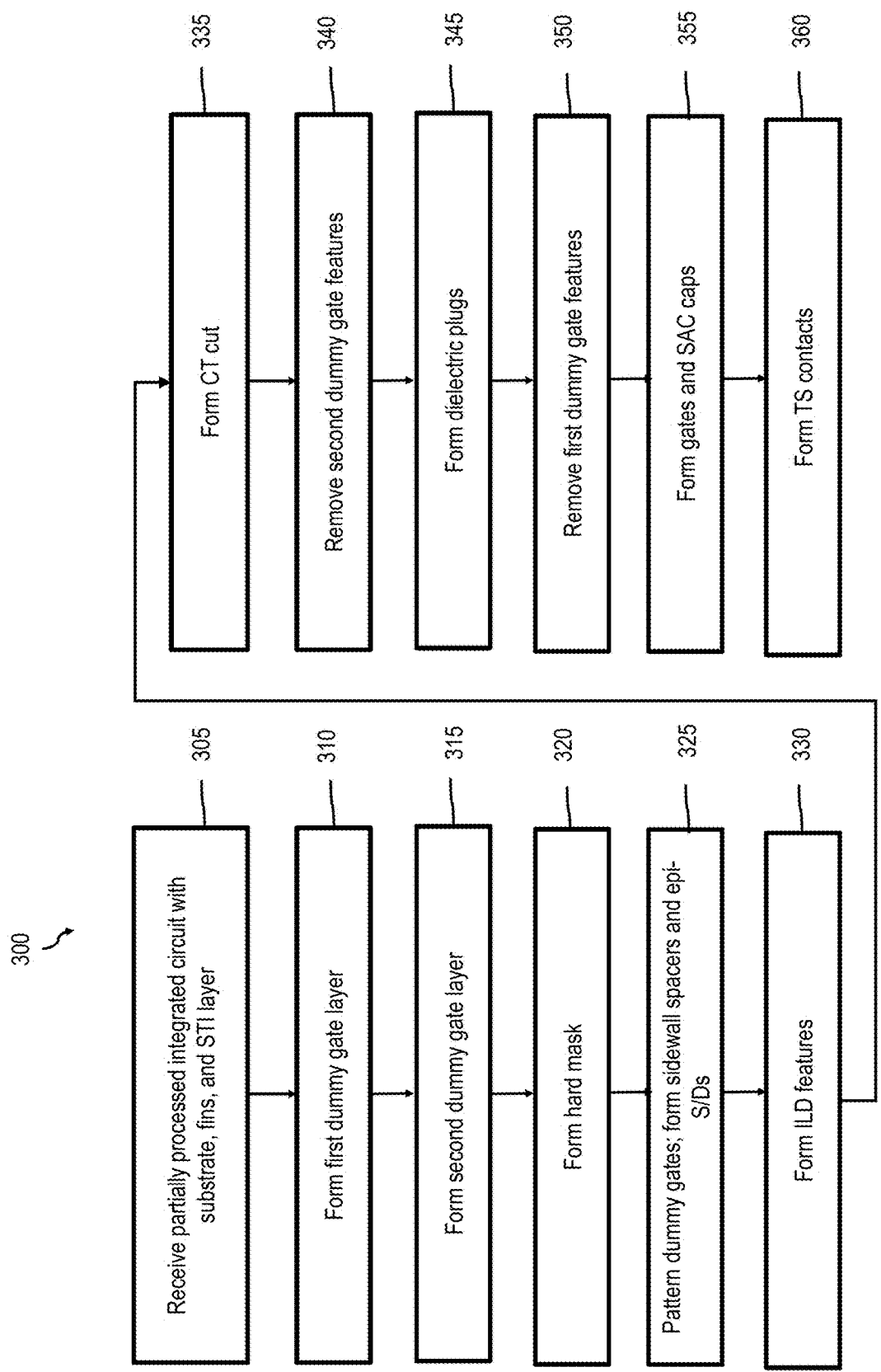
FIG. 3 shows a flow diagram of an illustrative method for forming the FIG. 1 FinFET layout.

FIG. 3 shows a flow diagram of a method 300 for forming the FinFET layout 100 in FIGS. 1-2D, in accordance with an illustrative embodiment of the invention. FIGS. 4A-14D, in turn, show intermediate film stacks formed when following the method 300, with each of the figures again indexed to the cleave planes shown in FIG. 1. Although the method 300 and the structures formed thereby are novel, many of the individual processing steps required to implement the method 300 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf, *Silicon Processing for the VLSI Era, Vol. 4: Deep-Submicron Process Technology*, Lattice Press, 2003; and H. Geng, *Semiconductor Manufacturing Handbook, Second Edition*, McGraw Hill Professional, 2017, both of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

Figure 4B:
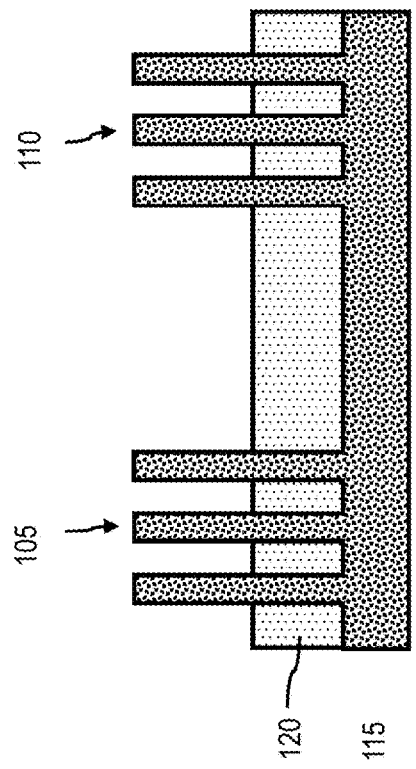
FIGS. 4A-4D show sectional views of a partially processed integrated circuit at the start of the FIG. 3 method.
Figure 4A:
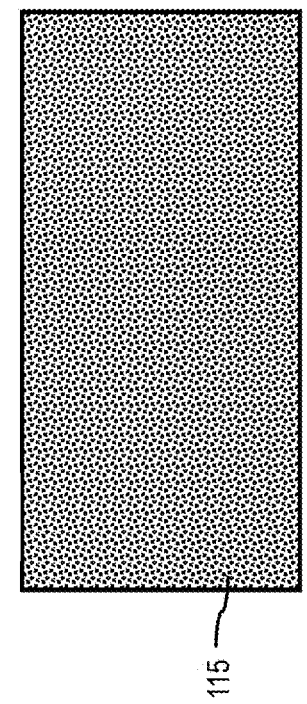
Figure 4D:
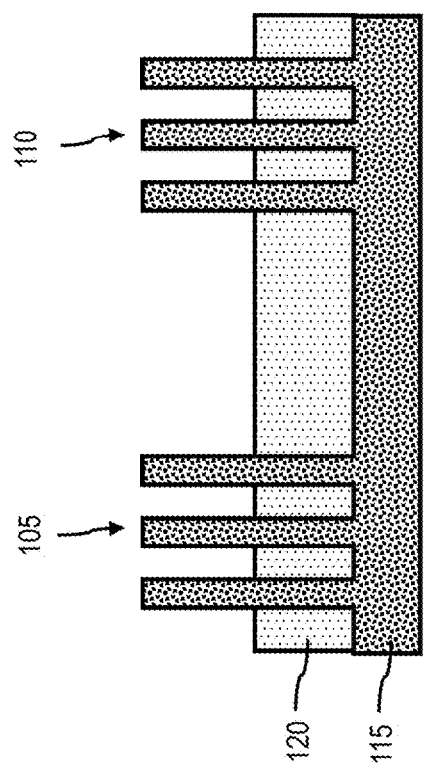
Figure 4C:
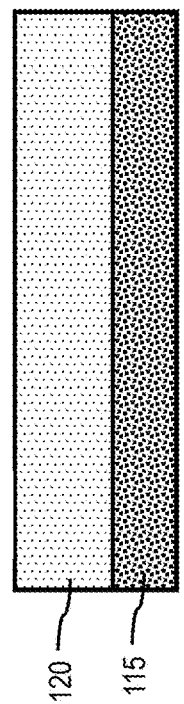

In the method 300 in FIG. 3, a partially processed integrated circuit (which is likely to be a component of a larger wafer) is received in step 305 with the substrate 115, the fins 105, 110, and the STI layer 120 already formed in the manner indicated in FIGS. 4A-4D, with FIG. 4A showing the partially processed integrated circuit along the A-A' cleave plane in FIG. 1, FIG. 4B showing the partially processed integrated circuit along the B-B' cleave plane in FIG. 1, FIG. 4C showing the partially processed integrated circuit along the C-C' cleave plane in FIG. 1, and FIG. 4D showing the partially processed integrated circuit along the D-D' cleave plane in FIG. 1. A first dummy gate layer 160 is then formed in step 310 to yield the film stack shown in FIG. 5A-5D, with FIG. 5A showing the film stack along the A-A' cleave plane in FIG. 1, FIG. 5B showing the film stack along the B-B' cleave plane in FIG. 1, FIG. 5C showing the film stack along the C-C' cleave plane in FIG. 1, and FIG. 5D showing the film stack along the D-D' cleave plane in FIG. 1. The first dummy gate layer 160 may, for instance, comprise polysilicon on a thin layer of silicon oxide. Deposition of the first dummy gate layer 160 may be by chemical vapor deposition (CVD), or by a combination of thermal oxidation and CVD.

Figure 6B:
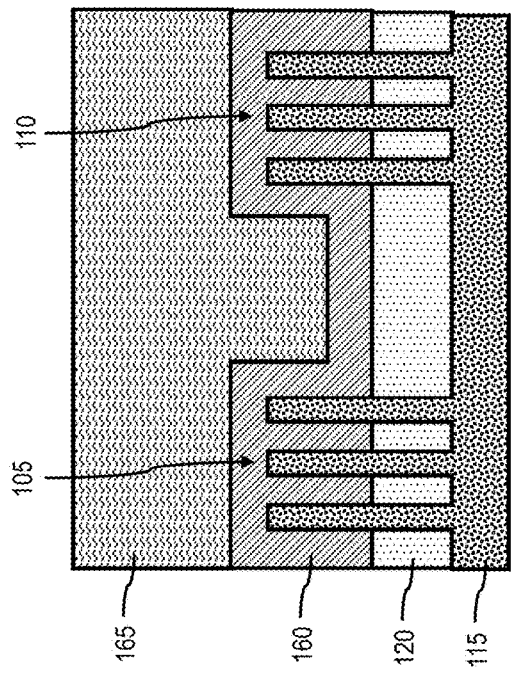
FIGS. 6A-6D show sectional views of an intermediate film stack produced by forming a second dummy gate layer in accordance with the FIG. 3 method.
Figure 6D:
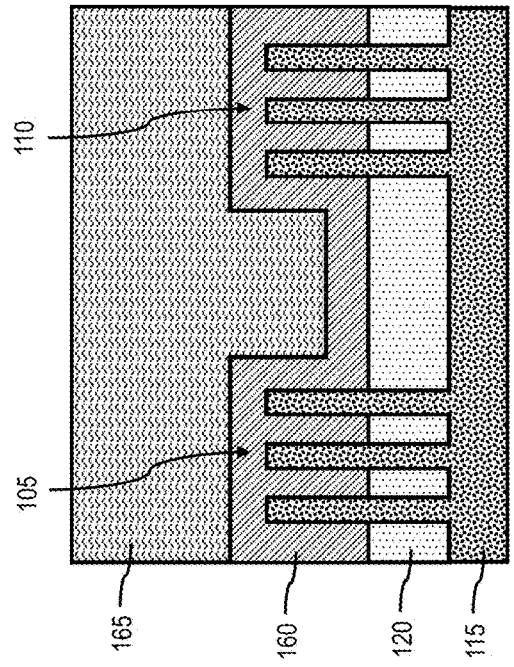
Figure 6A:
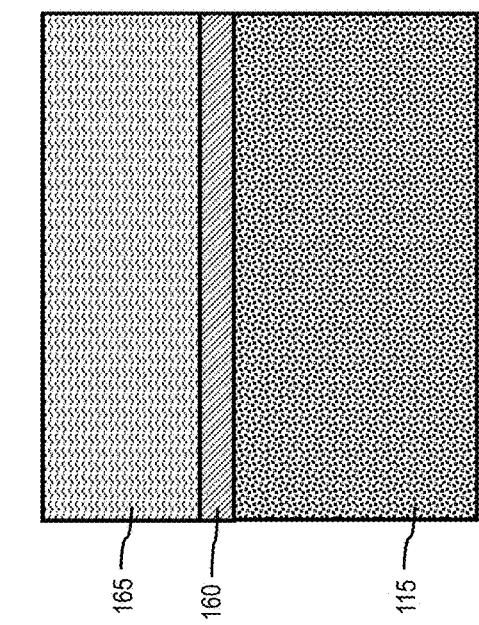
Figure 6C:
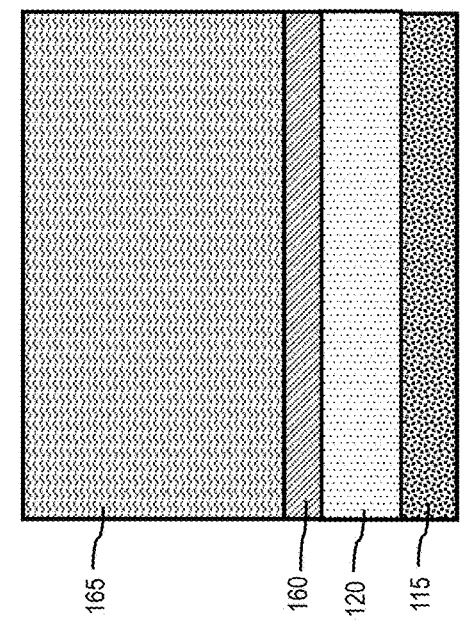

In step 315, a second dummy gate layer 165 is formed by deposition and planarization to yield the film stack shown in FIGS. 6A-6D, with FIG. 6A showing the film stack along the A-A' cleave plane in FIG. 1, FIG. 6B showing the film stack along the B-B' cleave plane in FIG. 1, FIG. 6C showing the film stack along the C-C' cleave plane in FIG. 1, and FIG. 6D showing the film stack along the D-D' cleave plane in FIG. 1. In one or more non-limiting embodiments the second dummy gate layer 165 may comprise silicon germanium. As will be detailed below, the choice of silicon germanium provides the opportunity to remove the second dummy gate layer 165 selective to other materials, making silicon germanium an attractive candidate for the second dummy gate layer 165 in the present illustrative process flow. Deposition may again be by CVD. Planarization may be by chemical-mechanical polishing (CMP).

Figure 7A:
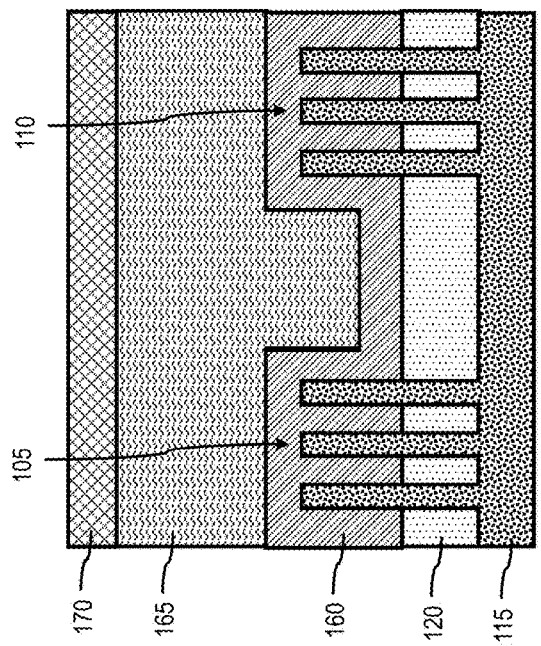
FIGS. 7A-7D show sectional views of an intermediate film stack produced by forming a hard mask in accordance with the FIG. 3 method.
Figure 7B:
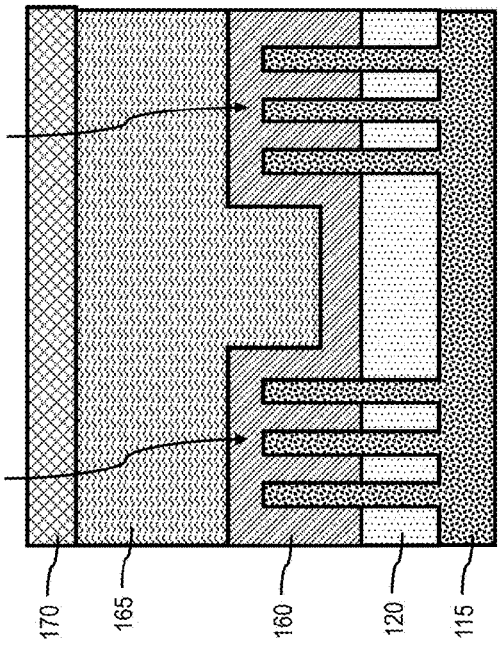
Figure 7C:
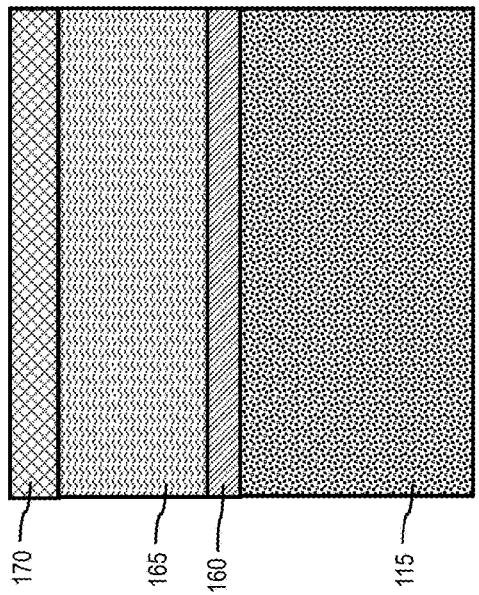
Figure 7D:
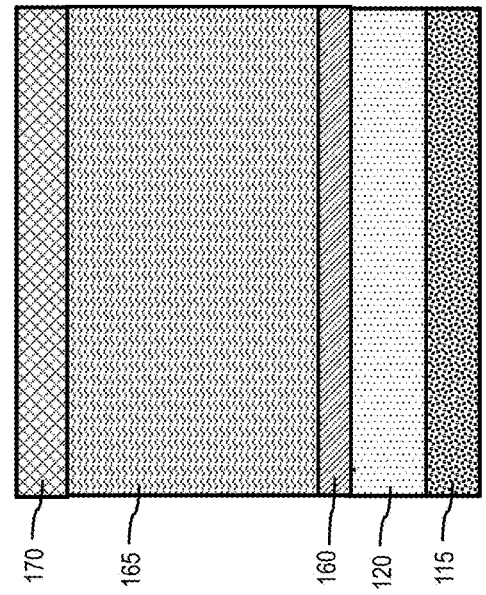
Figure 8A:
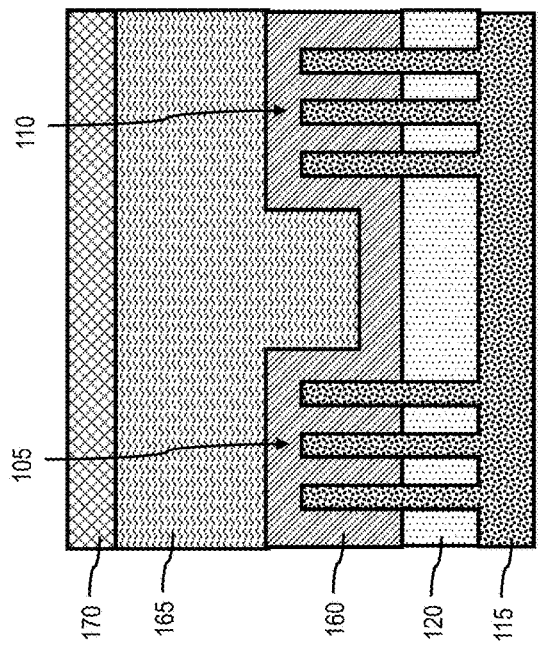
FIGS. 8A-8D show sectional views of an intermediate film stack produced by patterning dummy gates and forming sidewall spacers and epitaxial source/drains in accordance with the FIG. 3 method.
Figure 8B:
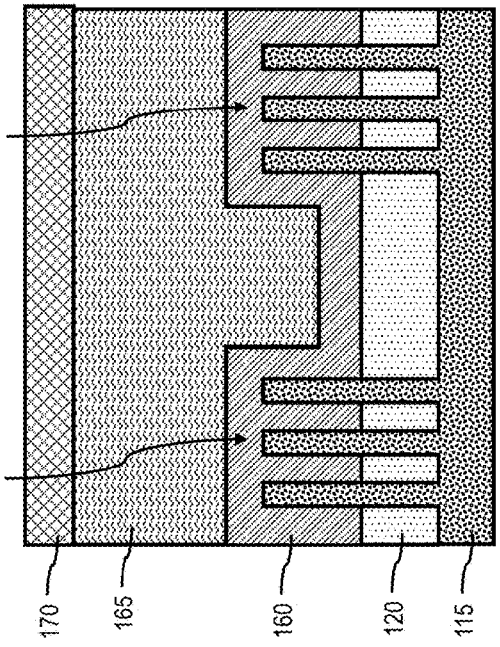
Figure 8C:
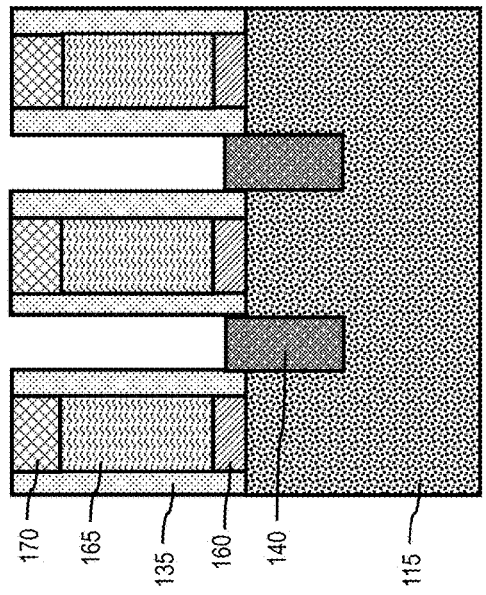
Figure 8D:
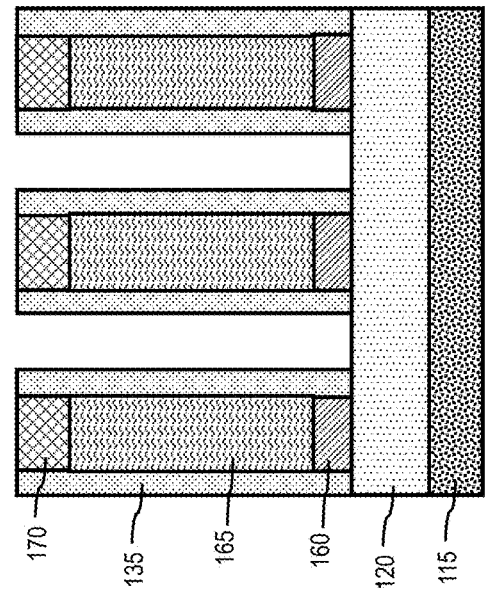

Next, in step 320, a hard mask 170 is formed. The hard mask 170 may, in one or more embodiments, comprise silicon nitride deposited by CVD. The resultant intermediate film stack is shown in FIGS. 7A-7D, with FIG. 7A showing the film stack along the A-A' cleave plane in FIG. 1, FIG. 7B showing the film stack along the B-B' cleave plane in FIG. 1, FIG. 7C showing the film stack along the C-C' cleave plane in FIG. 1, and FIG. 7D showing the film stack along the D-D' cleave plane in FIG. 1. With the hard mask 170 in place, the method may then progress to step 325, where the first and second dummy gate layers 160, 165 are patterned to form dummy gates composed of features of both layers. The sidewall spacers 135 and the epi-S/Ds 140 are also formed in step 325. The resultant film stack is shown in FIG. 8A-8D, with FIG. 8A showing the film stack along the A-A' cleave plane in FIG. 1, FIG. 8B showing the film stack along the B-B' cleave plane in FIG. 1, FIG. 8C showing the film stack along the C-C' cleave plane in FIG. 1, and FIG. 8D showing the film stack along the D-D' cleave plane in FIG. 1.

The various sub-steps in step 325 may be initiated by using photolithography to create a photoresist mask with openings over those portions of the film stack where etching is intended. Reactive ion etching (RIE) may then be utilized to pattern the hard mask 170, the first dummy gate layer 160, and the second dummy gate layer 165 to form the dummy gates comprising what are hereinafter called the first dummy gate features 160 and the second dummy gate features 165 to reflect the fact that they are no longer blanket layers. Subsequently, the photoresist may be stripped and, with the hard mask 170 still in place, the sidewall spacers 135 formed (e.g., silicon oxynitride). Sidewall spacer formation may be accomplished by, for example, blanket CVD followed by anisotropic RIE to remove any spacer material from horizontal surfaces. Following these sub-steps, the top of the exposed fins 105, 110 may be removed by RIE using the hard mask 170 and the sidewall spacers 135 as an etch mask, and then replacing the removed regions of the fins 105, 110 by a doped epitaxial material (e.g., silicon or silicon germanium) to form the epi-S/Ds 140. Selective vapor-phase epitaxy (VPE) is one candidate method for providing this epitaxial growth. Doping of the epi-S/Ds 140 may occur in situ during their growth or may be accomplished afterwards by ion implantation and suitable annealing.

The epi-S/Ds not only provide a means of precisely doping the source/drains in the FinFET layout 100, but also provide a means of adding strain to the channel regions of the FinFETs. If silicon germanium is utilized for the epi-S/Ds 140 and the fins 105, 110 are initially formed of crystalline silicon, for example, the lattice mismatch between the epi-S/Ds 140 and the adjacent channel regions strains those channel regions, leading to higher electron and hole mobilities.

Figure 9B:
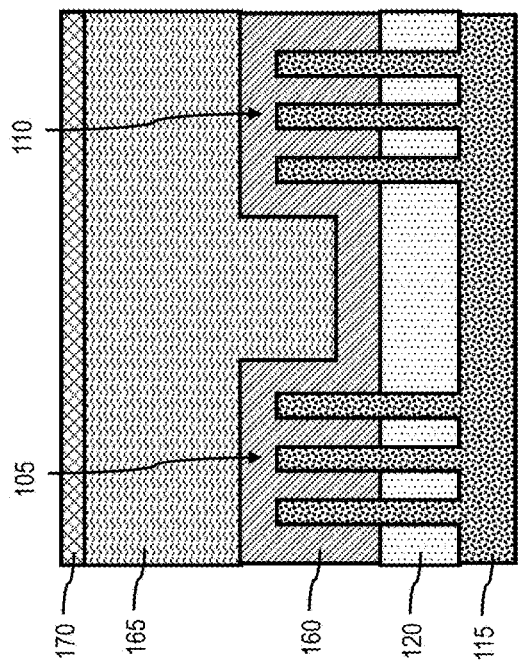
FIGS. 9A-9D show sectional views of an intermediate film stack produced by forming ILD features in accordance with the FIG. 3 method.
Figure 9D:
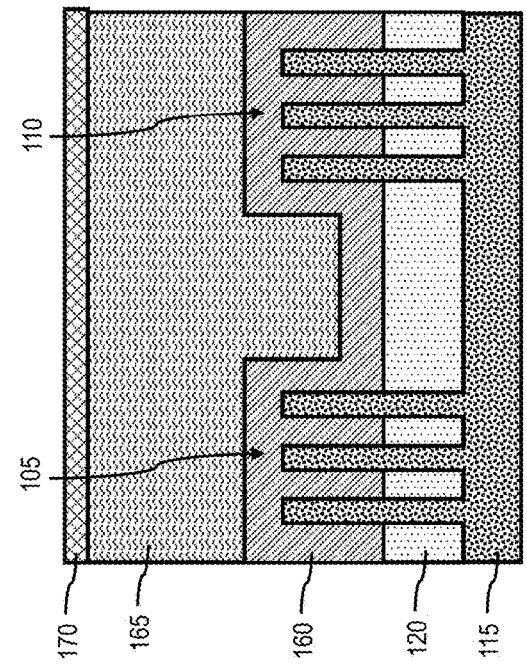
Figure 9A:
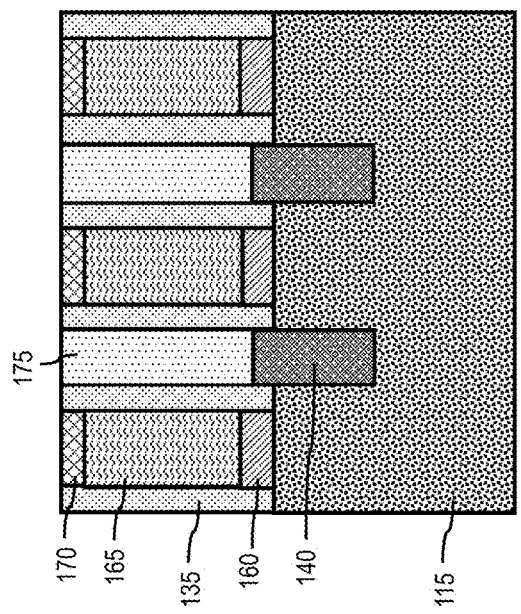
Figure 9C:
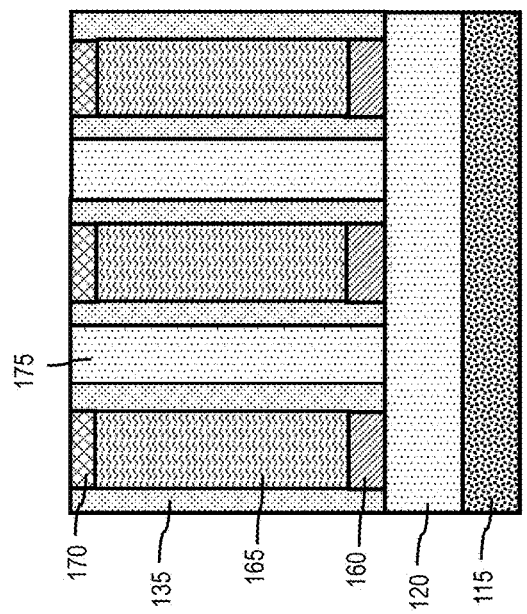

Subsequently, in step 330, interlayer dielectric (ILD) features 175 are formed to yield the intermediate film stack shown in FIGS. 9A-9D, with FIG. 9A showing the film stack along the A-A' cleave plane in FIG. 1, FIG. 9B showing the film stack along the B-B' cleave plane in FIG. 1, FIG. 9C showing the film stack along the C-C' cleave plane in FIG. 1, and FIG. 9D showing the film stack along the D-D' cleave plane in FIG. 1. The ILD features 175 occupy the regions above the epi-S/Ds 140 (between the dummy gates). The ILD features 175 may comprise, in one or more embodiments, a dielectric material such as silicon oxide. Deposition may occur by CVD. After deposition, CMP may be utilized to remove the just-deposited ILD material from the top of the film stack.

Figure 10B:
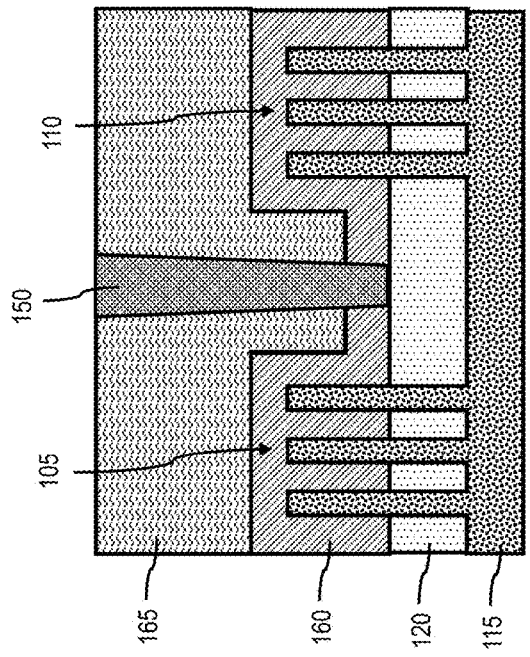
FIGS. 10A-10D show sectional views of an intermediate film stack produced by forming a CT cut in accordance with the FIG. 3 method.
Figure 10D:
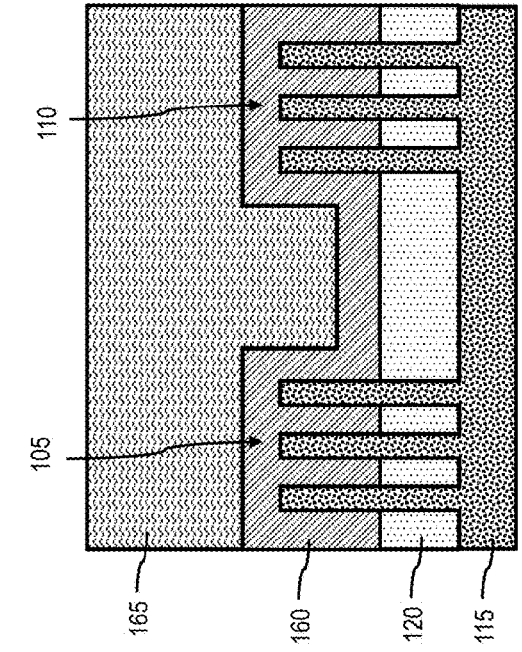
Figure 10A:
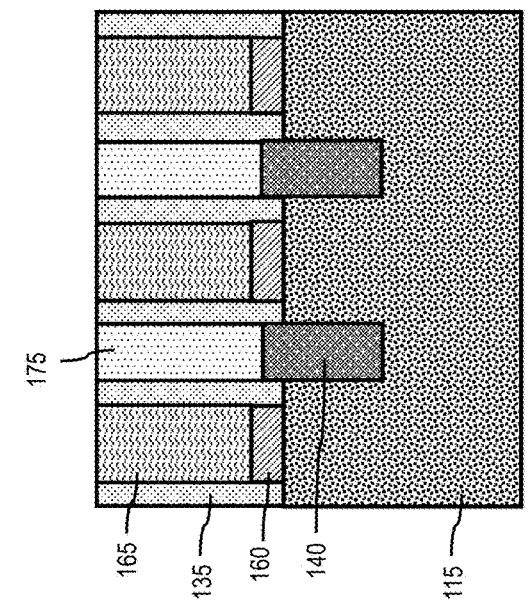
Figure 10C:
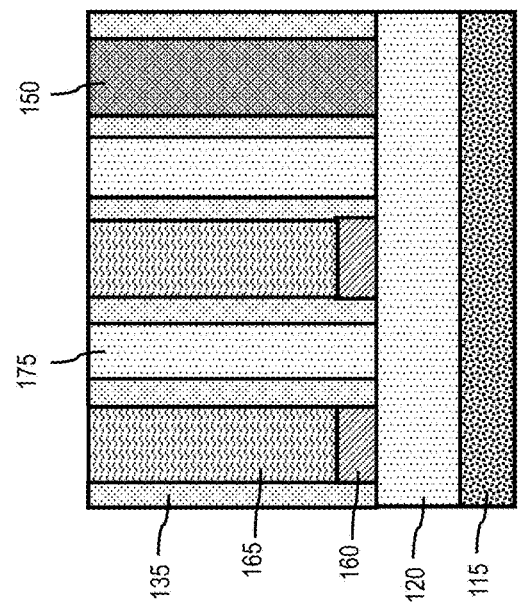

In step 335, the CT cut 150 is formed to yield the film stack shown in FIGS. 10A-10D, with FIG. 10A showing the film stack along the A-A' cleave plane in FIG. 1, FIG. 10B showing the film stack along the B-B' cleave plane in FIG. 1, FIG. 10C showing the film stack along the C-C' cleave plane in FIG. 1, and FIG. 10D showing the film stack along the D-D' cleave plane in FIG. 1. Formation of the CT cut 150 (e.g., silicon nitride) may be by, for example, photolithography and RIE to form the desired trench, followed by CVD and CMP. The CVD accomplishes the desired blanket deposition, and the CMP acts to remove excess CT-cut fill material from the top of the film stack. Notably, in planarizing the CT-cut material by CMP, the remaining hard mask 170 (e.g., silicon nitride) is also removed, and the tops of the sidewall spacers 135 (e.g., silicon oxynitride) are lowered.

Figure 11B:
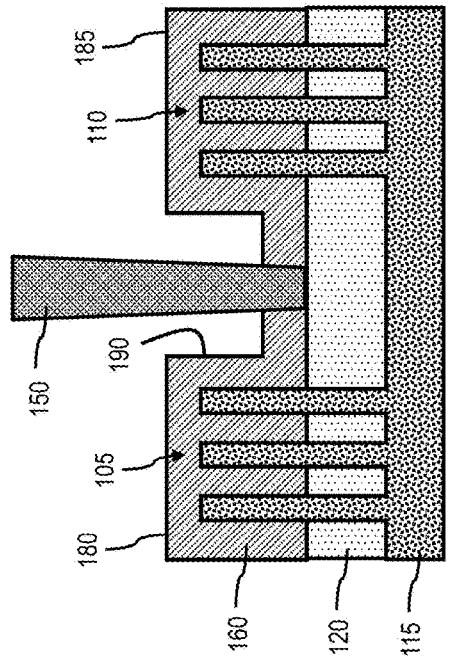
FIGS. 11A-11D show sectional views of an intermediate film stack produced by removing second dummy gate features in accordance with the FIG. 3 method.
Figure 11D:
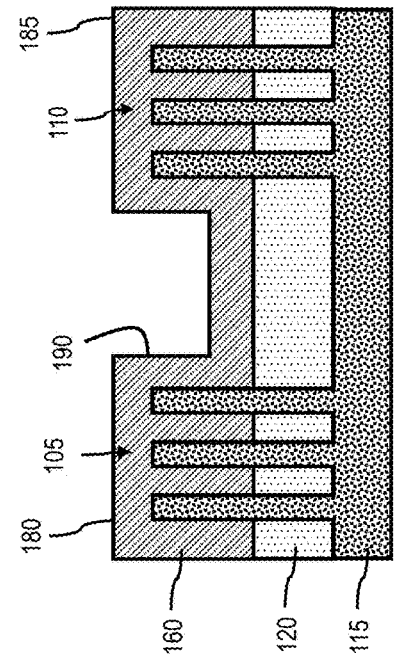
Figure 11A:
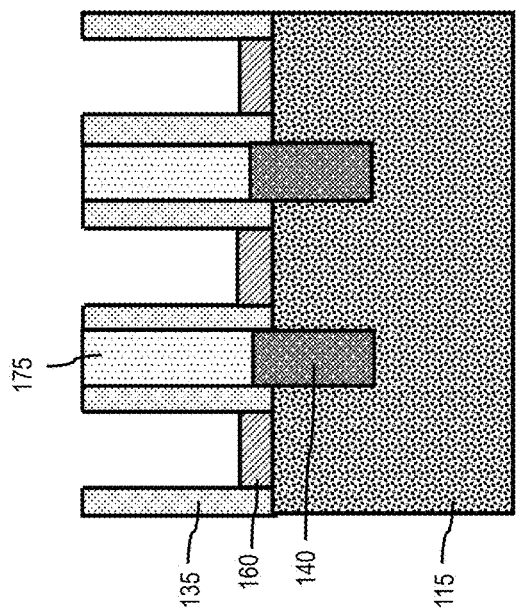
Figure 11C:
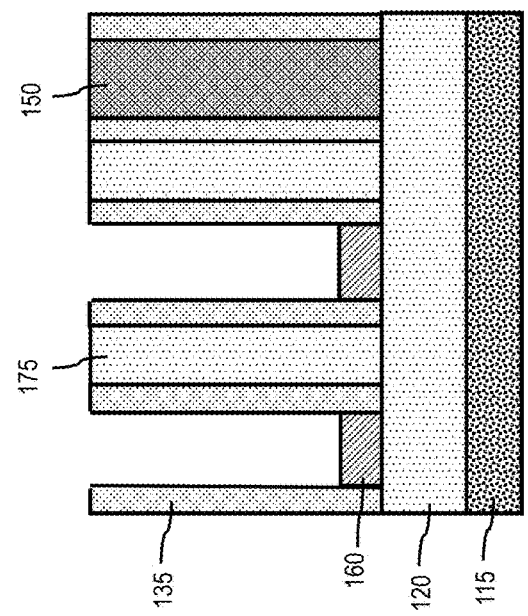

Continuing the method, step 340 has the second dummy gate features 165 (e.g., silicon germanium) removed, yielding the film stack shown in FIGS. 11A-11D, with FIG. 11A showing the film stack along the A-A' cleave plane in FIG. 1, FIG. 11B showing the film stack along the B-B' cleave plane in FIG. 1, FIG. 11C showing the film stack along the C-C' cleave plane in FIG. 1, and FIG. 11D showing the film stack along the D-D' cleave plane in FIG. 1. The use of silicon germanium for the second dummy gate features 165 provides the advantage of allowing this step to occur by a selective isotropic etch that fairly rapidly removes the silicon germanium while only very slowly etching other exposed elements of the film stack (e.g., polysilicon, silicon oxide, and silicon oxynitride). A suitable isotropic etch may comprise, for example, exposure to gaseous HCl.

Step 345 involves forming the dielectric plugs 155 to yield the film stack shown in FIGS. 12A-12D, with FIG.

Figure 12B:
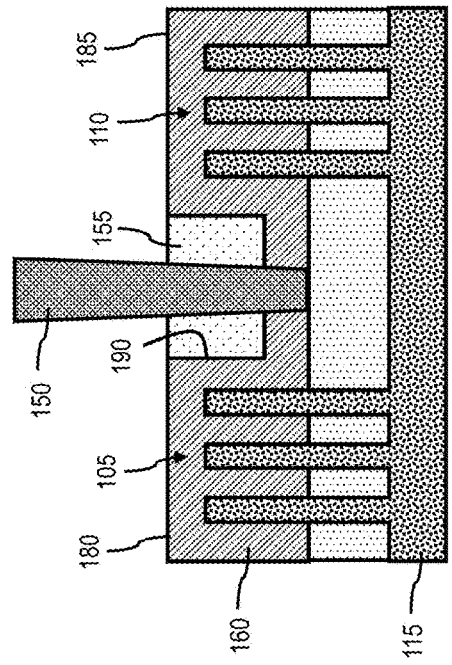
FIGS. 12A-12D show sectional views of an intermediate film stack produced by forming dielectric plugs in accordance with the FIG. 3 method.
Figure 12D:
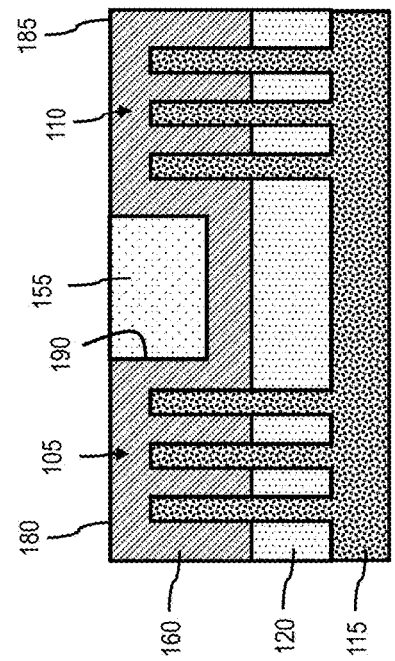
Figure 12A:
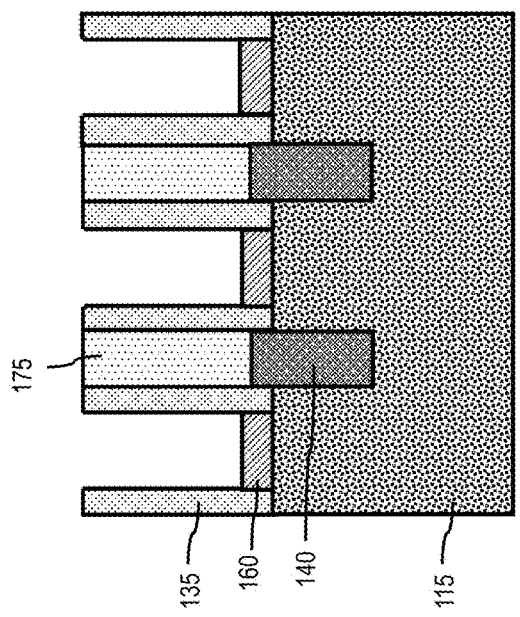
Figure 12C:
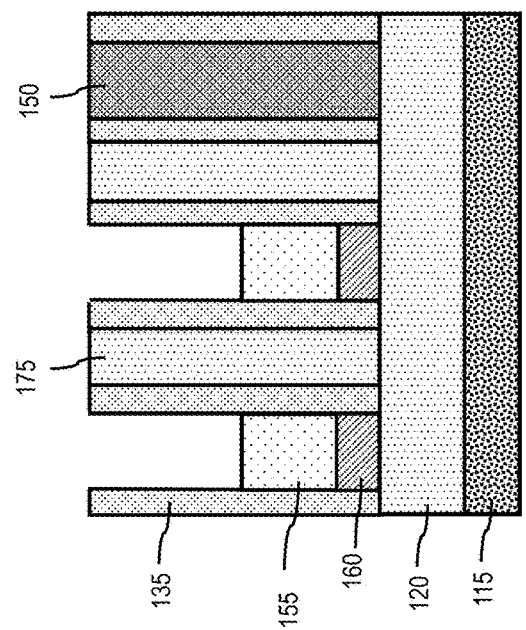

12A showing the film stack along the A-A' cleave plane in FIG. 1, FIG. 12B showing the film stack along the B-B' cleave plane in FIG. 1, FIG. 12C showing the film stack along the C-C' cleave plane in FIG. 1, and FIG. 12D showing the film stack along the D-D' cleave plane in FIG. 1. Reference back to FIGS. 11B and 11D will show that the first dummy gate features 160 (e.g., polysilicon) define first upper surfaces 180 over the first set of fins 105 and second upper surfaces 185 over the second set of fins 110. In between these sets of fins, the first dummy gate features 160 define recessed regions 190. It is in these recessed regions 190 that formation of the dielectric plugs 155 is desired.

Some more conventional dielectric CVD processes such as plasma-enhanced CVD (PECVD) may be unable to adequately fill the recessed regions 190 because of their high aspect ratio. For this reason, a flowable CVD (F-CVD) process may be preferred where conventional CVD methods fall short due to inadequate gap fill capabilities. Suitable candidate dielectric materials for the dielectric plugs 155 include, but are not limited to, silicon carbide, silicon carbon oxide, silicon carbon nitride, and silicon carbon oxynitride (SiCON). In a typical F-CVD process, a film is deposited by PECVD and continues to flow immediately after deposition, allowing excellent gap fill performance. After deposition, the just-deposited film is typically cured so it becomes more robust. Flowable CVD processes are described in, as just one example, US Patent Publication No. 2018/0025907 to Applied Materials Inc., which is hereby incorporated by reference herein. This reference describes the deposition of SiCON by F-CVD deposition using tetravinylsilane (TVS) in combination with a remote $NH_3$ plasma at temperatures in the range of about 80° C., 100° C., and 130° C., with a pressure less than about 1 torr. SiCON was also obtained by FCVD from silicontetraacetalide and a remote $NH_3$ plasma at temperatures in the range of about 0° C. to about 80° C., 100° C., and 130° C., with pressures again less than about 1 torr.

Once the dielectric layer for the dielectric plugs 155 is blanket deposited on the first dummy gate features 160 and other exposed surfaces of the film stack, it may be etched back by RIE so that the dielectric plugs 155 only remain in the recessed regions 190 of the first dummy gate features 160. Etching back removes the just-deposited dielectric layer from the first and second upper surfaces 180, 185 of the first dummy gate features 160. The film stack in FIGS. 12A-12D remains with the dielectric plugs 155 placed in the regions where the first dummy gate features 160 pass between the first set of fins 105 and the second set of fins 110.

Figure 13B:
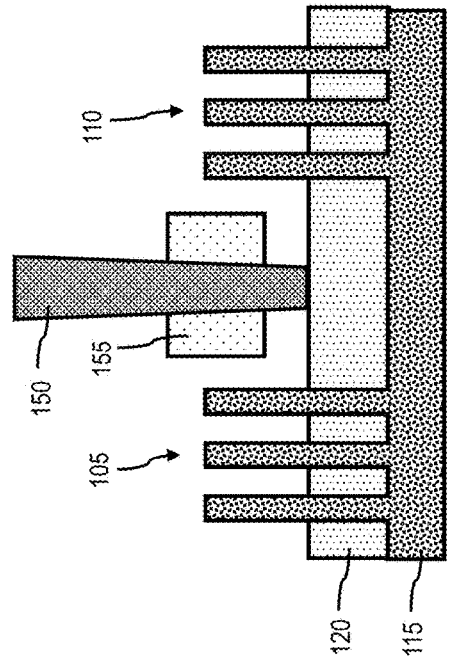
FIGS. 13A-13D show sectional views of an intermediate film stack produced by removing first dummy gate features in accordance with the FIG. 3 method.
Figure 13D:
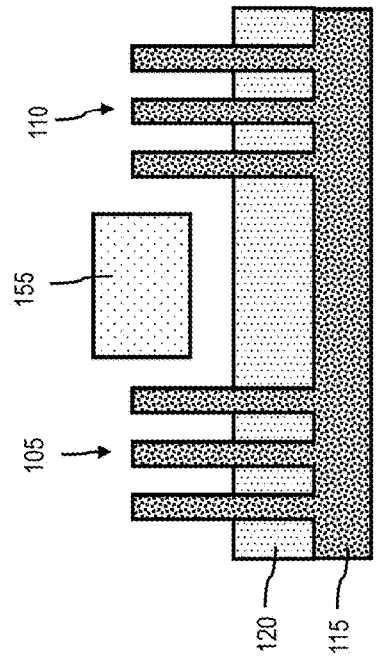
Figure 13A:
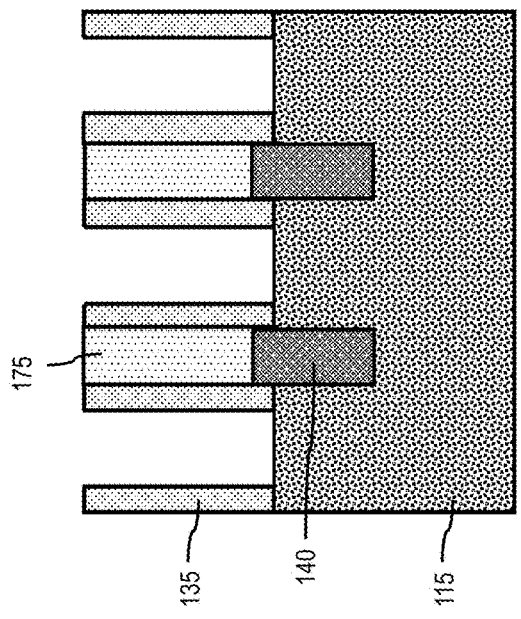
Figure 13C:
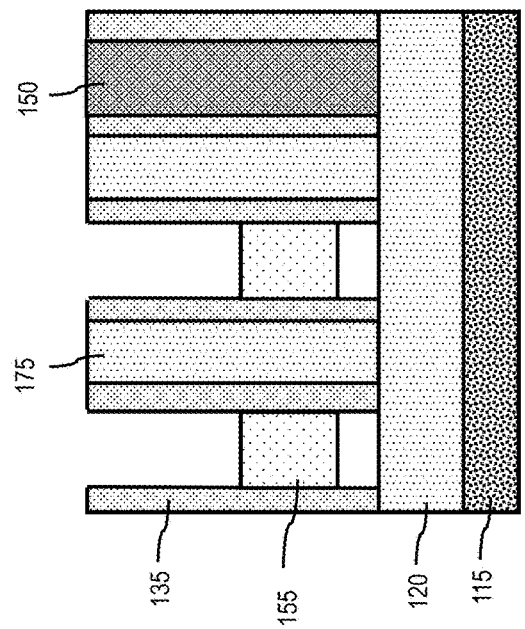

With the dielectric plugs 155 formed in this manner, the method progresses to step 350 where the first dummy gate features 160 (e.g., polysilicon) are removed to yield the film stack shown in FIGS. 13A-13D, with FIG. 13A showing the film stack along the A-A' cleave plane in FIG. 1, FIG. 13B showing the film stack along the B-B' cleave plane in FIG. 1, FIG. 13C showing the film stack along the C-C' cleave plane in FIG. 1, and FIG. 13D showing the film stack along the D-D' cleave plane in FIG. 1. If the first dummy gate features 160 comprise polysilicon, a selective wet etch is preferably chosen that rapidly removes the polysilicon while only very slowly etching other exposed elements of the gate stack.

Figure 14B:
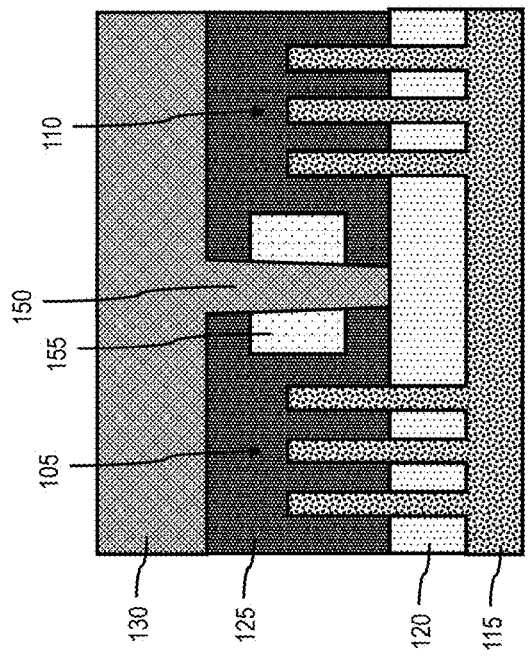
FIGS. 14A-14D show sectional views of an intermediate film stack produced by forming gates and SAC caps in accordance with the FIG. 3 method.
Figure 14D:
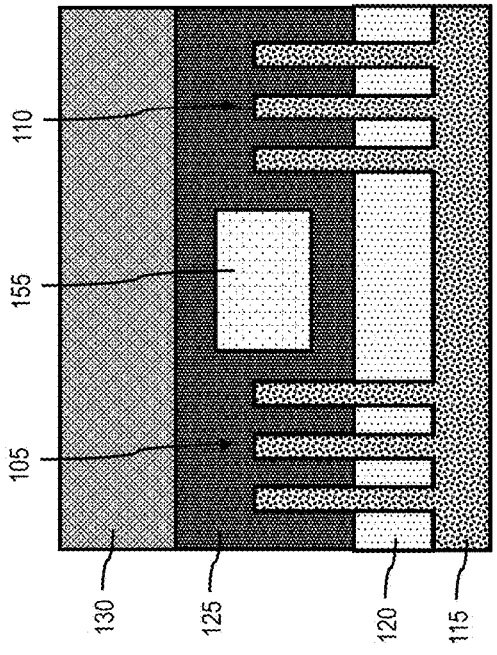
Figure 14A:
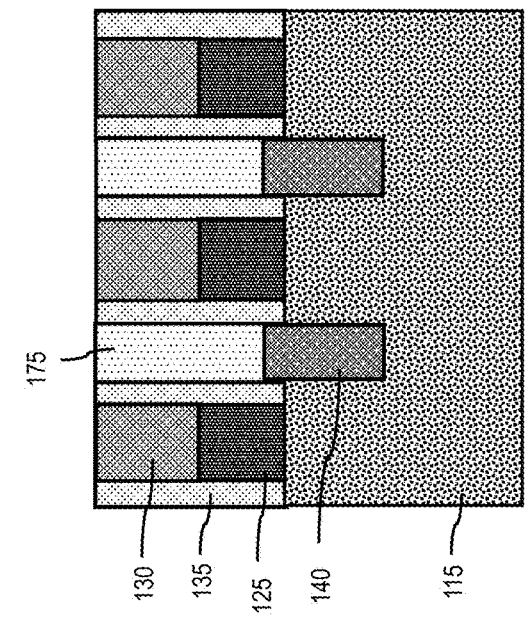
Figure 14C:
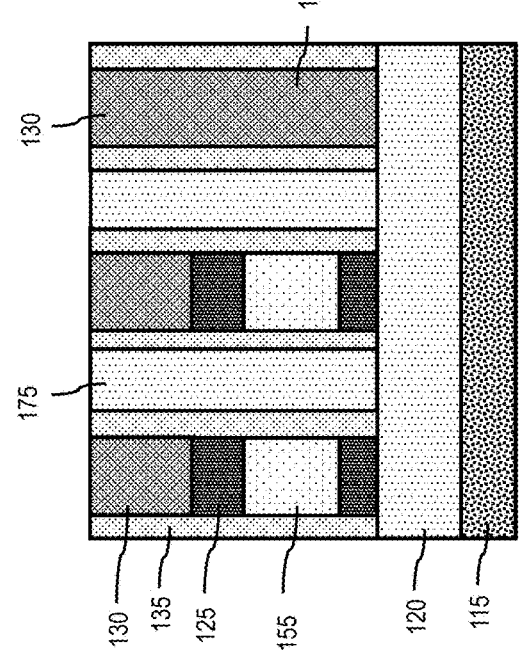

In step 355, the gates 125 (e.g., HKMGs) and the SAC caps 130 (e.g., tungsten) are formed in the trenches previously occupied by the first and second dummy gate features 160, 165 to yield the film stack shown in FIGS. 14A-14D, with FIG. 14A showing the film stack along the A-A' cleave plane in FIG. 1, FIG. 14B showing the film stack along the B-B' cleave plane in FIG. 1, FIG. 14C showing the film stack along the C-C' cleave plane in FIG. 1, and FIG. 14D showing the film stack along the D-D' cleave plane in FIG. 1. This is what is sometimes referred to as a "replacement gate-last process." The components of the HKMGs may, in one or more embodiments, be deposited by atomic layer deposition (ALD), CVD, or some combination of those two processes. The SAC caps 130 (e.g., silicon nitride) may then be deposited by CVD. Excess material may be removed from the top of the film stack by CMP.

Finally, in step 360, the TS contacts 145 are formed by what is frequently called a "damascene" process to yield the FinFET layout 100 originally presented in FIGS. 2A-2D. Initially, the ILD features 175 may be removed by a selective wet etch that removes the ILD features 175 (e.g., silicon oxide) while not etching, or only very slowly etching, the other exposed portions of the film stack. With the trenches for the TS contacts 145 now open, a liner may be deposited by CVD and then the bulk of the TS contacts 145 (e.g., tungsten) may be deposited by CVD. Excess material may then be removed from the top of the film stack by CMP to yield the FinFET layout 100. The liner may help to promote adhesion of the TS contacts 145 and to inhibit interdiffusion between elements. In one or more embodiments, the liner may comprise, for example, titanium nitride.

Accordingly, in the manner described above and in the appended figures, an integrated circuit may comprise a first set of fins (e.g., first set of fins 105) and a second set of fins (e.g., second set of fins 110) discrete from the first set of fins. A gate (e.g., one of gates 125) passes over the first set of fins and the second set of fins. A dielectric plug (e.g., one of dielectric plugs 155) is surrounded on two sides by the gate where the gate passes between the first set of fins and the second set of fins.

Likewise, a method (e.g., method 300) of forming an integrated circuit, as well as an integrated circuit formed by that method, are described. A partially processed integrated circuit is received with a first set of fins (e.g., first set of fins 105) and a second set of fins (e.g., second set of fins 110) discrete from the first set of fins. A gate (e.g., one of gates 125) is formed so that it passes over the first set of fins and the second set of fins. The gate surrounds a dielectric plug (e.g., one of dielectric plugs 155) on two sides where the gate passes between the first set of fins 105 and a second set of fins.

As touched on above, embodiments in accordance with aspects of the invention provide several advantages over more conventional designs, particularly in FinFET-based integrated circuits where gates run in parallel to, and in close proximity to, contacts-to-source/drains (TS contacts). In the illustrative FinFET layout 100, for example, the regions where the gates 125 pass between sets of fins 105, 110 are also the regions where the gates 125 have the maximum overlap with adjacent TS contacts 145 (see, e.g., FIGS. 1-2D). Placing the dielectric plugs 155 in these regions is precisely where they will have the maximum effect in lowering parasitic capacitance. Aspects of the invention are thereby well suited to improving integrated circuit performance.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would fall within the scope of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. An integrated circuit comprising:
   a first set of fins protruding upward from a substrate;
   a second set of fins protruding upward from the substrate, discrete from the first set of fins;
   a gate passing above the first set of fins and the second set of fins; and
   a dielectric plug surrounded by the gate on two sides where the gate passes between the first set of fins and the second set of fins,
   wherein the gate protrudes in a first portion and a second portion on opposite sides of the dielectric plug, and the first portion is closer to the substrate than is the second portion.

2. The integrated circuit of claim 1, further comprising two sidewall spacers abutting opposed sides of the gate and opposed sides of the dielectric plug.

3. The integrated circuit of claim 1, further comprising an electrically conductive contact running parallel to the gate.

4. The integrated circuit of claim 3, wherein the electrically conductive contact passes over the first set of fins and the second set of fins.

5. The integrated circuit of claim 3, wherein the dielectric plug is positioned lateral to and horizontally level with a portion of the electrically conductive contact.

6. The integrated circuit of claim 3, further comprising two sidewall spacers abutting opposed sides of the gate, wherein one of the two sidewall spacers separates the gate and the electrically conductive contact.

7. The integrated circuit of claim 3, wherein the dielectric plug reduces a parasitic capacitance between the gate and the electrically conductive contact.

8. The integrated circuit of claim 1, wherein the integrated circuit comprises a fin-based field effect transistor.

9. The integrated circuit of claim 1, wherein the gate comprises a high-k metal gate.

10. The integrated circuit of claim 1, wherein the dielectric plug comprises silicon and carbon.

11. The integrated circuit of claim 10, wherein the dielectric plug further comprises at least one of oxygen and nitrogen.

12. An integrated circuit formed at least in part by the steps of:
    receiving a partially processed integrated circuit with a first set of fins protruding upward from a substrate and a second set of fins protruding upward from the substrate discrete from the first set of fins; and
    forming a gate passing above the first set of fins and the second set of fins, the gate surrounding a dielectric plug on two sides where the gate passes between the first set of fins and the second set of fins,
    wherein the gate protrudes in a first portion and a second portion on opposite sides of the dielectric plug, and the first portion is closer to the substrate than is the second portion.

13. The integrated circuit of claim 3, wherein the electrically conductive contact has a gap adjacent to the dielectric plug.

* * * * *